April 20, 1965 | G. V. BOYNTON | 3,178,905

HEAT SINK

Filed Oct. 15, 1962

INVENTOR.
GEORGE V. BOYNTON

BY George C. Sullivan

Agent

United States Patent Office 3,178,905 Patented Apr. 20, 1965

3,178,905
HEAT SINK

George V. Boynton, Kent, Wash., assignor to Lockheed Aircraft Corporation, Burbank, Calif.
Filed Oct. 15, 1962, Ser. No. 230,495
3 Claims. (Cl. 62—515)

The present invention relates in general to heat limiting devices and in particular to a novel heat sink to reduce the possibility of overheating electronic components during the solder function of the components to a ciruit board.

The electrical components for many electrical systems are mounted on printed circuit support panels or boards. When components, as for example, transistors, are mounted on circuit boards, special problems are encountered because of their small size and their delicate terminal leads which are easily damaged or destroyed by heat. Heretofore, damage to electrical components being mounted on a circuit board has been reduced by several schemes, for example, by using a pliable and porous felt-like insulating member which separates the mounting components from the support panel. This method of reducing heat damage to circuit elements has obvious disadvantages—for example, additional space and weight are taken up by the use of a felt-like insulating member. Also, the felt-like insulating member is not rigid, and has increased possibility of damage due to an environment which may vibrate. Another scheme is the use of a high heat conductive metal clamp similar to an alligator clip which is attached to the base of the component. The obvious disadvantage to the alligator clip type of heat sink is the inaccessibility of soldering irons to the terminal base which is also being held by the alligator clip.

It is, therefore, the object of the present invention to provide an improved heat limiting device, useful in very confined and restricted locations on component boards to reduce the possibility of overheating circuit components during the soldering function of circuit board assembly.

One object of the present invention is in the use of a spring actuated gripping member which aids in positioning and holding the heat sink adjacent to the electronic component terminal lead to insure a positive heat transfer.

Another object of the present invention is the use of a felt insert which is disposed within the heat sink and saturated with a volatile fluid to provide for positive cooling of the terminal.

These and other novel features and characteristics of the present invention will become apparent upon a perusal of the following drawings and specifications, of which:

Figure 1:
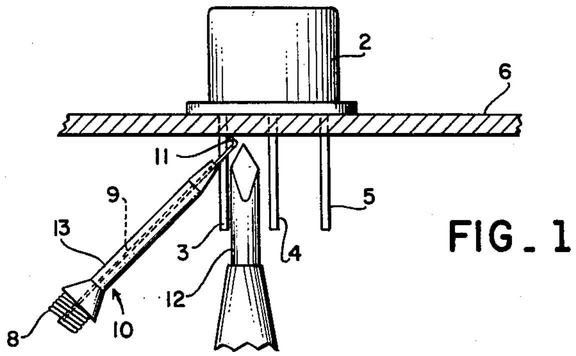
FIGURE 1 is a perspective view showing a novel heat sink being applied to an electronic component terminal.

Referring now to the drawings, FIGURE 1 shows an electronic component, for example, a transistor 2 with three leads or wires 3, 4, and 5, which would normally be, in the case of an ordinary junction transistor, terminal leads for the base, collector and emitter electrodes. Transistor 2 is to be mounted on a support panel 6, for example, a laminated plastic circuit board. Holes (not shown) are provided within circuit board 6 to accommodate the terminal leads 3, 4, and 5 of transistor 2.

Just prior to soldering each of the leads 3, 4, and 5, heat sink 10 is positioned adjacent to the terminal to be soldered, for example, terminal 3 as shown in FIGURE 1. By applying finger pressure to spring 8 of heat sink

10, spring 8 compresses and in turn extends angle wire 9 outwardly from the tip of heat sink 10. Wire 9 is provided with a convenient hook 11 to grip terminal wire 3. When the technician releases pressure from spring 8, the bias provided by spring 8 will pull the heat sink 10 snugly adjacent to lead 3. Then the solder function of terminal 3 may be completed and excess heat from solder iron 12 will be conducted to heat sink 10 rather than along lead 3 to transistor 2.

Figure 2:
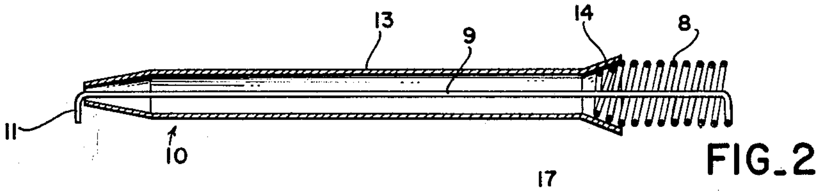
FIGURE 2 is a cross-section of one embodiment of a present heat sink.

Several alternative embodiments may be used to provide a heat sink in accordance with the present invention. For example, FIGURE 2 shows an embodiment as depicted in FIGURE 1 comprising a slender tubing 13 as of aluminum or some other good heat conductive material, having a flared end portion 14. The tip end of tubing 13 may be tapered if so desired to provide a smaller mass for access to extremely confined areas. A slender wire 9 which is bent at one end to form a spring member 8 is inserted into tubing 13 from the flared end. The other end of wire 9, which protrudes from the tip of tube 13, is conveniently bent to provide a hook 11 for gripping the terminal wire. Hook 11 is positioned such as to maintain a compression bias on the spring 8 at all times.

Figure 3:
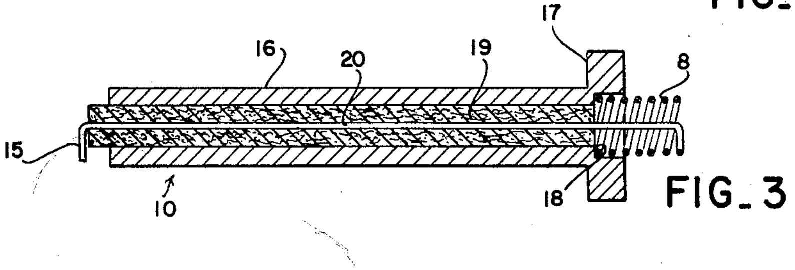
FIGURE 3 and FIGURE 4 are cross-sections of alternative embodiments of a heat sink.

Another embodiment of a heat sink in accordance with the present invention is shown in FIGURE 3 which comprises a tubing member 16, as of aluminum or some metal with a high thermal conductivity, provided with a shoulder 17 at one end thereof. A step member 18 is provided near the shoulder end of tubing 16 as by sinking a counterbore therein. A slender column of fibrous material 19 as of, for example, felt, is inserted into tubing 16 having a portion thereof extending outside the tip end of tube 16. A wire member 20 is passed through this center of the felt cylinder 19 and bent to form the hook 20 at the tip end thereof, the other end of wire 20 is bent into a spring 8 at the other end, the spring 10 being seated in the step member 18 formed within tubing 16.

During the soldering process, the extending felt portion of heat sink 15 is dipped into a fluid, as for example, alcohol or some other fluid which evaporates rapidly. When the heat sink is then placed against a terminal wire to be soldered, the alcohol, rapidly evaporating from the melt, provides for a high degree of cooling.

Figure 4:
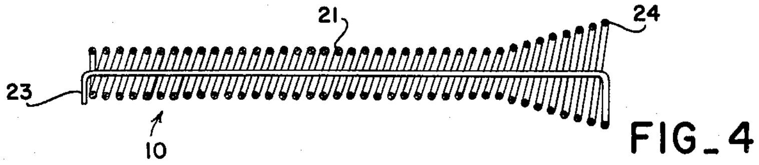
Figure 5:
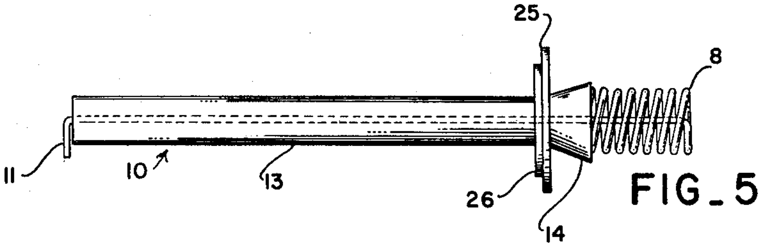
FIGURE 5 is an alternate embodiment of the device shown in FIGURE 2.

FIGURE 4 shows another embodiment of a heat sink according to the present invention. A cylinder 21 is formed of wire having a flared spring portion 24 at one end thereof. The wire at the spring end is bent back through the center of wire cylinder 21 and terminates in a hook 23, extending out the tip end thereof.

A convenient gripper to aid in handling the heat sink may be provided by fitting the heat sink through an apertured disc 25 against the flared end portion 14 thereof. Disc 25 may then be locked into position by any convenient means, as for example, lock ring 26.

What has been shown and described is an inexpensive, small heat sink extremely useful in the soldering function of delicate electronic components that are disposed in difficult to reach areas.

It is to be understood in connection with this invention that the embodiments shown are only exemplary, and that various modifications can be made in construction and arrangement within the scope of the invention as defined in the appended claims.

What is claimed is:

1. A heat sink comprising: a hollow tubular member, said hollow tubular member provided with an outwardly extending portion at one end and a tapered end portion at the other end; a spring, a first end of said spring seated in the outwardly extending portion of said tubular member, an elongated wire extending from the second end of said spring, the elongated wire being bent at a point adjacent to the second end of said spring and extending through said spring and hollow tubular member, a portion of said wire extending beyond the tapered end of said hollow tubular member being bent at an angle to maintain compression bias on said spring member.

2. A heat sink comprising a hollow tubular member, said hollow tubular member provided with an outwardly extending portion at a first end thereof, a porous cylindrical insert, said insert being disposed within the hollow tubular member and extending from a position adjacent the outwardly extending portion of said hollow tubular member to a second end thereof, a spring, a first end of said spring seated in the outwardly extending end of said tubular member, a second end of said spring member including an elongated wire portion extending therefrom, means whereby the elongated wire portion is positioned through said spring member and the cylindrical insert and extending beyond the second end of said hollow tubular member, the end of said wire member bent at an angle to maintain compression bias on said spring member.

3. A heat sink as claimed in claim 2 wherein said tubular member is composed of a material having a good thermal conductivity.

References Cited by the Examiner

UNITED STATES PATENTS

| | | | |
|---|---|---|---|
| 680,304 | 8/01 | Wightman | 113—99 |
| 1,240,901 | 9/17 | Symons | 113—111 |
| 2,257,122 | 9/41 | O'Connor | 113—99 |

OTHER REFERENCES

Electronic Design, April 1, 1959, "Wet Felt Sinks Heat," p. 103.

CHARLES W. LANHAM, *Primary Examiner.*

JOHN F. CAMPBELL, *Examiner.*